(12) United States Patent
Ishida

(10) Patent No.: US 10,093,834 B2
(45) Date of Patent: Oct. 9, 2018

(54) POLISHING COMPOSITION AND POLISHING METHOD

(71) Applicant: FUJIMI INCORPORATED, Kiyosu-shi, Aichi (JP)

(72) Inventor: Yasuto Ishida, Miaoli County (CN)

(73) Assignee: FUJIMI INCORPORATED, Kiyosu-Shi (JP)

(*) Notice: Subject to any disclaimer, the term of this patent is extended or adjusted under 35 U.S.C. 154(b) by 0 days.

(21) Appl. No.: 15/514,130

(22) PCT Filed: Aug. 28, 2015

(86) PCT No.: PCT/JP2015/004378
§ 371 (c)(1),
(2) Date: Mar. 24, 2017

(87) PCT Pub. No.: WO2016/051659
PCT Pub. Date: Apr. 7, 2016

(65) Prior Publication Data
US 2017/0298253 A1     Oct. 19, 2017

(30) Foreign Application Priority Data

Sep. 29, 2014   (JP) .................. 2014-197860

(51) Int. Cl.
| | | |
|---|---|---|
| *C09G 1/02* | (2006.01) | |
| *B24B 37/04* | (2012.01) | |
| *C09K 3/14* | (2006.01) | |
| *H01L 21/321* | (2006.01) | |
| *H01L 21/3105* | (2006.01) | |

(52) U.S. Cl.
CPC .............. *C09G 1/02* (2013.01); *B24B 37/044* (2013.01); *C09K 3/1436* (2013.01); *H01L 21/31053* (2013.01); *H01L 21/3212* (2013.01)

(58) Field of Classification Search
CPC ...... C09G 1/02; C09K 3/1436; B24B 37/044; H01L 21/3212
See application file for complete search history.

(56) References Cited

U.S. PATENT DOCUMENTS

| | | | |
|---|---|---|---|
| 9,206,336 B2* | 12/2015 | Takahashi | ............ C09K 3/1463 |
| 2002/0128327 A1 | 9/2002 | Ishitobi et al. | |
| 2004/0229552 A1* | 11/2004 | Cherian | ................ B24B 37/044 |
| | | | 451/41 |
| 2008/0104893 A1 | 5/2008 | Oh | |
| 2013/0146804 A1 | 6/2013 | Mizuno et al. | |

FOREIGN PATENT DOCUMENTS

| | | | |
|---|---|---|---|
| CN | H04-214022 A | 8/1992 | |
| CN | 1788061 A1 | 6/2006 | |
| CN | 101177603 A | 5/2008 | |
| CN | 102358824 A | 2/2012 | |
| CN | 103180101 A | 6/2013 | |
| JP | 2001-131535 A | 5/2001 | |
| JP | 2002-020732 A | 1/2002 | |
| JP | 2005-014204 A | 1/2005 | |
| JP | 2005-023313 A | 1/2005 | |
| JP | 2005-034986 A | 2/2005 | |
| JP | 2007-103457 A | 4/2007 | |
| JP | 2007-168034 A | 7/2007 | |
| JP | 2009-227893 A | 10/2009 | |
| JP | 2009-289886 A | 12/2009 | |
| JP | WO 2013108777 | * 7/2013 | ............... C09K 3/14 |
| JP | 2015-137297 A | 7/2015 | |
| TW | 200516122 A | 5/2005 | |
| TW | 200525016 A | 8/2005 | |
| WO | WO-2004/101695 A1 | 11/2004 | |
| WO | WO-2004/111145 A1 | 12/2004 | |
| WO | WO-2005/000984 A1 | 1/2005 | |

* cited by examiner

*Primary Examiner* — Nadine G Norton
*Assistant Examiner* — Mahmoud Dahimene
(74) *Attorney, Agent, or Firm* — Foley & Lardner LLP

(57) ABSTRACT

There are provided a polishing composition and a method for polishing capable of, when a substrate including polysilicon is polished, limiting the polishing rate of the polysilicon, and selectively polishing a silicon compound other than the polysilicon, such as silicon nitride. The polishing composition used includes abrasives, an organic acid and a conjugate base of the organic acid.

17 Claims, No Drawings

POLISHING COMPOSITION AND
POLISHING METHOD

TECHNICAL FIELD

The present invention relates to compositions for polishing (hereinafter polishing compositions) and methods for polishing. The present invention particularly relates to a method for polishing a layer containing elemental silicon, by which a silicon compound other than the elemental silicon is selectively polished while limiting the polishing rate of the elemental silicon.

BACKGROUND ART

Manufacturing process of semiconductor devices include a step of polishing an object made of elemental silicon (e.g., polysilicon, single crystalline silicon, or amorphous silicon), silicon compounds, metals or the like. In this step, when a semiconductor to be manufactured includes a gate electrode made of polysilicon and a silicon-based material other than polysilicon surrounding the gate electrode, such a silicon-base material other than polysilicon, which may be silicon nitride or silicon dioxide, is required to be polished preferentially. For instance, Patent Literature 1 proposes a polishing liquid capable of polishing a layer containing a silicon material other than polysilicon quickly and limiting the polishing of polysilicon. The polishing liquid proposed contains colloidal particles, organic acid, and at least one nonionic additive selected from nonionic surfactant and nonionic hydrophilic resin. Such a polishing liquid, however, does not have good washing efficiency because it contains nonionic additive and the nonionic additive remains after the polishing. Therefore this polishing liquid does not satisfy user's demand fully.

CITATION LIST

Patent Literature

PTL 1: JP 2009-289886 A

SUMMARY OF INVENTION

Technical Problem

The present invention aims to provide a polishing composition and a method for polishing to solve the problems of the conventional techniques as stated above. According to the present invention, when a polishing object including elemental silicon, a silicon compound, metals and the like is polished, the polishing rate of the elemental silicon, such as polysilicon, single crystalline silicon, or amorphous silicon, especially the polishing rate of polysilicon, can be limited, and the silicon compound other than the elemental silicon, such as a silicon nitride or silicon dioxide, can be selectively polished.

Solution to Problem

To solve the above problems, a polishing composition according to one embodiment of the present invention includes: abrasives, an organic acid and a conjugate base of this organic acid.

A polishing composition according to one embodiment may include abrasives, an organic acid and a conjugate base of the organic acid.

In the polishing composition in this embodiment, the organic acid may have a value of pKa that is 0.3 or more and 6.0 or less, and the polishing composition may have a value of pH that is equal to or higher than a value smaller than the value of pKa of the organic acid by 1.0 unit and that is equal to or lower than a value larger than the value of pKa by 1.5 units.

In the polishing composition in this embodiment, the conjugate base of the organic acid may be at least one type selected from ammonium salt, sodium salt and potassium salt.

In the polishing composition in this embodiment, the abrasives may be silica with an organic acid immobilized to a surface of the silica.

In the polishing composition in this embodiment, content of the abrasives may be 0.1% by mass or more and 20.0% by mass or less.

In the polishing composition in this embodiment, content of the conjugate base of the organic acid may be 0.01% by mass or more and 10.0% by mass or less.

This polishing composition can be used for polishing a substrate including elemental silicon, especially polysilicon.

A method for polishing according to another aspect of the present invention includes polishing a polishing object using the polishing composition according to the above embodiment. In this method for polishing, the polishing object may be a substrate including polysilicon.

Advantageous Effects of Invention

A polishing composition and a method for polishing of the present invention are capable of, when a polishing object includes elemental silicon, limiting the polishing rate of the elemental silicon, especially polysilicon. According to the polishing composition and the method for polishing, while limiting the polishing rate of elemental silicon, especially polysilicon, a silicon compound other than the elemental silicon, such as a silicon nitride or silicon dioxide, can be polished at a high polishing rate.

DESCRIPTION OF EMBODIMENTS

The following describes embodiments of the present invention in details. A polishing composition of the present embodiment can be prepared by mixing abrasives, organic acid, and a conjugate base of the organic acid.

This polishing composition is suitably used for polishing of an object such as elemental silicon, silicon compounds or metals, e.g., for polishing the surface of a wiring substrate made of silicon, containing elemental silicon, a silicon compound, or metals, during the manufacturing process of a semiconductor device. The polishing composition is particularly suitably used for polishing of a substrate containing polysilicon. Elemental silicon includes polysilicon, single crystalline silicon, and amorphous silicon. Polysilicon includes typical polysilicon and modified polysilicon. Modified polysilicon includes silicon doped with impurities such as B or P in polysilicon. Silicon compounds include silicon nitride, silicon oxide and silicon carbide. A silicon compound film includes a low-permittivity coat having specific permittivity of 3 or less. This polishing composition enables limiting of a polishing rate of the elemental silicon and polishing of the silicon compounds other than the elemental silicon at a high polishing rate.

The following describes the polishing composition of the present embodiment in details.

1. Abrasives

Abrasives used may be any one of inorganic particles, organic particles, and organic-inorganic composite particles. Specific examples of the inorganic particles include particles made of metal oxides such as silica, alumina, ceria, and titania, silicon nitride particles, silicon carbide particles, and boron nitride particles. Specific examples of the organic particles include polymethyl methacrylate (PMMA) particles. Such abrasives may be used singly or in combination of two or more types of them. For the abrasives, a commercial product or a synthetic product may be used.

Of these types of abrasives, silica is preferable, and colloidal silica is especially preferable.

(Surface Modification)

Abrasives may be surface-modified. Since typical colloidal silica has the value of zeta potential close to zero under the acid condition, such silica particles do not repel one another electrically but easily coagulate under the acid condition. On the contrary, surface-modified abrasives having a relatively large negative value of zeta potential even under the acid condition repel one another intensively even under the condition, and are dispersed favorably. As a result, the polishing composition can have improved storage stability. For instance, such surface-modified abrasives can be obtained by mixing metals such as aluminum, titanium or zirconium or their oxides with abrasives so as to dope them at the surface of the abrasives.

In one embodiment, colloidal silica with organic acid immobilized thereto may be used. Organic acid may be immobilized to the surface of colloidal silica included in the polishing composition by chemically bonding a functional group of the organic acid with the surface of colloidal silica, for example. When colloidal silica and organic acid simply coexist, such organic acid is not immobilized with the colloidal silica. When sulfonic acid as one type of the organic acid is immobilized to colloidal silica, this is achieved by the method described in "Sulfonic acid-functionalized silica through quantitative oxidation of thiol groups", Chem. Commun. 246-247 (2003), for example. Specifically, colloidal silica with sulfonic acid immobilized to the surface can be obtained by coupling a silane coupling agent having a thiol group, such as 3-mercaptopropyltrimethoxysilane, to colloidal silica and then oxidizing the thiol group with hydrogen peroxide.

Alternatively, carboxylic acid may be immobilized to colloidal silica, for example, by the method described in "Novel Silane Coupling Agents Containing a Photolabile 2-Nitrobenzyl Ester for Introduction of a Carboxy Group on the Surface of Silica Gel", Chemistry Letters, 3, 228-229 (2000). Specifically, colloidal silica with carboxylic acid immobilized to the surface can be obtained by coupling a silane coupling agent containing a photoreactive 2-nitrobenzyl ester to colloidal silica and then irradiating with light.

Alternatively as disclosed by JP H4-214022 A, basic aluminum salt or basic zirconium salt may be added to silica to produce cationic silica, and this cationic silica may be used as abrasives.

(Aspect Ratio)

Preferably abrasives in the polishing composition have an aspect ratio with the upper limit of less than 1.5, preferably 1.3 or less and more preferably 1.1 or less. Such a range enables favorable surface roughness, which results from the shape of the abrasives. The aspect ratio can be found as follows. An image of the abrasives is observed with a scanning electron microscope electron microscope. Then, a minimum rectangle that is circumscribed around each grain image is found, and the average of values obtained by dividing the long side length of the rectangle by the short side length is the aspect ratio, which can be obtained using typical image analysis software.

(Primary Particle Diameter)

The lower limit of the average primary particle diameter of the abrasives is preferably 5 nm or more, more preferably 7 nm or more and further preferably 10 nm or more. The upper limit of the average primary particle diameter of the abrasives is preferably 200 nm or less, more preferably 150 nm or less and further preferably 100 nm or less. Such a range leads to the improvement in polishing rate of a polishing object by the polishing composition, and can suppress dishing on the surface of the polishing object after polishing using the polishing composition. The average primary particle diameter of abrasives can be calculated in accordance with the specific surface area of the abrasives measured by the BET method, for example.

(Secondary Particle Diameter)

The lower limit of the average secondary particle diameter of the abrasives is preferably 25 nm or more, more preferably 30 nm or more and further preferably 35 nm or more. The upper limit of the average secondary particle diameter of the abrasives is preferably 300 nm or less, more preferably 260 nm or less and further preferably 220 nm or less. Such a range leads to the improvement in polishing rate of a polishing object by the polishing composition, and can suppress surface defects on the surface of the polishing object after polishing using the polishing composition. The secondary particles here refer to the particles formed by assembly of abrasives in the polishing composition. The average secondary particle diameter of these secondary particles can be measured by dynamic light scattering, for example.

The lower limit of the content of the abrasives in the polishing composition is preferably 0.005% by weight or more, more preferably 0.5% by weight or more, further preferably 1% by weight or more, and the most preferably 3% by weight or more. The upper limit of the content of the abrasives in the polishing composition is preferably 50% by weight or less, more preferably 30% by weight or less, and further preferably 20% by weight or less.

The content of abrasives in the polishing composition that is 0.005% by weight or more leads to the improvement in polishing rate of a polishing object, and 50% by weight or less leads to reduction in cost of the polishing composition, and can suppress surface defects on the surface of the polishing object after polishing using the polishing composition.

2. Organic Acid and Conjugate Base of the Organic Acid

In one embodiment of the present invention, the types of organic acid are not limited especially. For instance, preferable examples include carbonic acid, acetic acid, succinic acid, phthalic acid and citric acid. Conjugate base of organic acid may be a conjugate base of the organic acid used. In one embodiment, the conjugate base is selected from ammonium salt, sodium salt and potassium salt.

The lower limit of the content (concentration) of organic acid in the polishing composition is not particularly limited because organic acid exerts its effect even in a small amount. The preferable content is 0.01 g/L or more, more preferably 0.1 g/L or more, and further preferably 10 g/L or more. The upper limit of the content (concentration) of organic acid in the polishing composition of the present invention is preferably 100 g/L or less, more preferably 50 g/L or less, and further preferably 25 g/L or less.

The lower limit of the content (concentration) of conjugate base in the polishing composition is not particularly limited because conjugate base exerts its effect even in a small amount. The preferable content is 0.01 g/L or more, more preferably 0.1 g/L or more, and further preferably 1 g/L or more. The upper limit of the content (concentration) of conjugate base in the polishing composition of the present invention is preferably 100 g/L or less, more preferably 50 g/L or less, and further preferably 25 g/L or less. It is important in the present invention to include organic acid and conjugate base of the organic acid, and to keep the relationship between pKa of the organic acid and pH of the polishing composition to be within a certain range. Therefore the types and the contents of the organic acid and the conjugate base of the organic acid have to be selected and adjusted appropriately in accordance with the design of the polishing composition.

In one embodiment of the present invention, organic acid and conjugate base of the organic acid are used in combination because such a combination presumably can have "buffer capacity" so as to keep the concentration of $OH^-$ acting on elemental silicon constant. Presumably elemental silicon is polished by dissolving Si in water by $OH^-$ as indicated in the following chemical reaction formula:

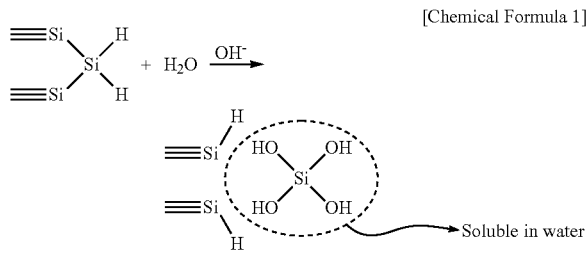

[Chemical Formula 1]

Without wishing to be bound by theory, $H^+$ and $OH^-$ are received in the system of organic acid and conjugate base of the organic acid. Therefore it can be considered that, even when $H^+$ and $OH^-$ are excessively mixed, the amount of $H^+$ and $OH^-$ can be kept constant in the system. For instance, in the system of acetic acid and ammonium acetate, when $H^+$ is mixed in the slurry, acetate ions absorb $H^+$ through the following chemical reaction:

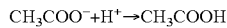

When $OH^-$ is mixed in the slurry, undissociated acetate absorbs $OH^-$ as in the following chemical reaction formula:

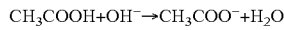

In this way, in the system of organic acid and conjugate base of the organic acid, $H^+$ and $OH^-$ are received. As a result, OH-acting on elemental silicon is consumed by the buffering reaction in the slurry, and the polishing rate of the elemental silicon is decreased presumably. Further, when pH is close to pKa of the organic acid, the amount of $OH^-$ is very small. Therefore presumably when $OH^-$ is absorbed in the slurry even in the small amount, the effect of limiting the polishing rate can be obtained remarkably.

On the contrary, when organic acid and conjugate base of another organic acid other than this organic acid are combined or when organic acid and a conjugate base of inorganic acid are combined, $H^+$ and $OH^-$ are not always kept constant in the system. Therefore $OH^-$ acting on the elemental silicon is not consumed in the reaction in the slurry, so that the polishing rate of the elemental silicon does not change. That is, the present invention is based on the finding that a combination of organic acid and a conjugate base of this organic acid can lead to the effect of limiting the polishing of elemental silicon.

In the polishing composition in one embodiment, organic acid has the value of pKa that is 0.3 or more and 6.0 or less, and the polishing composition may have a value of pH that is equal to or higher than a value that is smaller than the value of pKa by 1.0 unit and that is equal to or lower than a value that is larger than the value of pKa by 1.5 units. Such a range of the pKa value leads to the tendency of limiting the polishing rate of the elemental silicon. Presumably this is because $OH^-$ ions are the cause of the polishing rate of elemental silicon, and therefore the polishing rate of elemental silicon can be limited by controlling $OH^-$ ions. When pH of the polishing composition is not within the above range relative to the value of pKa of organic acid, the effect of limiting polishing rate of elemental silicon is decreased.

When organic acid is multivalent, the value of pKa of the organic acid has the pKa in number corresponding to the valence. Then one of the values of pKa may be 0.3 or more and 6.0 or less. Examples of the organic acid having the value of pKa that is 0.3 or more and 6.0 or less include carbonic acid, acetic acid, succinic acid, phthalic acid and citric acid.

3. Additives

Various additives, such as pH adjusting agent, complexing agent, surfactant, water-soluble polymer, and fungicide, may be added to the polishing composition so as to improve the performance of the polishing composition.

(pH Adjusting Agent)

The value of pH of the polishing composition may be adjusted by adding a pH adjusting agent. Such a pH adjusting agent that is used as needed to adjust the value of pH of the polishing composition to a desired value may be either acid or alkali, and may be either an inorganic compound or an organic compound.

Specific examples of the acid as the pH adjusting agent include inorganic acid, and organic acid such as carboxylic acid or organic sulfuric acid. Organic acid as the pH adjusting agent may be of a type overlapping with the organic acid that is used together with a conjugate base as long as it is within the range not interfering with the effect of limiting the polishing rate of elemental silicon. Specific examples of inorganic acid include sulfuric acid, nitric acid, boric acid, carbonic acid, hypophosphorous acid, phosphorous acid, and phosphoric acid. Specific examples of carboxylic acid include formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid; glyceric acid, oxalic acid, malonic acid, succinic acid, glutaric acid, adipic acid, pimelic acid, maleic acid, phthalic acid, malic acid, tartaric acid, citric acid and lactic acid. Specific examples of organic sulfuric acid include methanesulfonic acid, ethanesulfonic acid, and isethionic acid. These acids may be used singly or in combination of two or more types of them.

Specific examples of the base as the pH adjusting agent include hydroxides of alkali metals or salts thereof, hydroxides of alkali earth metals or salts thereof, quaternary ammonium hydroxide or salts thereof, ammonia, and amines.

Specific examples of alkali metals include potassium and sodium. Specific examples of alkali earth metals include calcium and strontium. Specific examples of salts include carbonates, hydrogen carbonates, hydrosulfates, and acetates. Specific examples of quaternary ammoniums include tetramethylammonium, tetraethylammonium, and tetrabutylammonium.

Specific examples of quaternary ammonium hydroxide compounds include quaternary ammonium hydroxide or a salt thereof, and their specific examples include tetramethylammonium hydroxide, tetraethylammonium hydroxide, and tetrabutylammonium hydroxide.

Specific examples of amine include methylamine, dimethylamine, trimethylamine, ethylamine, diethylamine, triethylamine, ethylenediamine, monoethanolamine, N-(β-aminoethyl)ethanolamine, hexamethylenediamine, diethylenetriamine, triethylenetetramine, anhydrous piperazine, piperazine hexahydrate, 1-(2-aminoethyl)piperazine, N-methylpiperazine and guanidine. These bases can be used singly or in combination of two or more types of them.

Of these bases, ammonia, ammonium salt, alkali metal hydroxide, alkali metal salt, quaternary ammonium hydroxide compounds, and amines are preferable, and ammonia, potassium compounds, sodium hydroxide, quaternary ammonium hydroxide compounds, ammonium hydrogen carbonate, ammonium carbonate, sodium hydrogen carbonate, and sodium carbonate are more preferable.

More preferably the polishing composition includes a potassium compound as the base from the viewpoint of prevention of metallic contamination. Examples of potassium compound include hydroxides of potassium and potassium salts, and their specific examples include potassium hydroxide, potassium carbonate, potassium hydrogen carbonate, potassium sulfate, potassium acetate and potassium chloride.

(Complexing Agent)

In order to improve the polishing rate of a polishing object by the polishing composition, a complexing agent may be added to the polishing composition. The complexing agent has an action of chemically etching the surface of the polishing object. Specific examples of the complexing agent include inorganic acid or a salt thereof, organic acid or a salt thereof, a nitrile compound, amino acid, and a chelating agent. Organic acid as the complexing agent may be of a type overlapping with the organic acid that is used together with a conjugate base as long as it is within the range not interfering with the effect of limiting the polishing rate of elemental silicon. These complexing agents may be used singly or in combination of two or more types of them. For the complexing agent, a commercial product or a synthetic product may be used.

Specific examples of the inorganic acid include hydrochloric acid, sulfuric acid, nitric acid, carbonic acid, boric acid, tetrafluoroboric acid, hypophosphorous acid, phosphorous acid, phosphoric acid, and pyrophosphoric acid.

Specific examples of the organic acid include a carboxylic acid and a sulfonic acid. Specific examples of the carboxylic acid include a monovalent carboxylic acid, such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, lactic acid, glycolic acid, glyceric acid, benzoic acid, and salicylic acid, and a polyvalent carboxylic acid such as oxalic acid, malonic acid, succinic acid, glutaric acid, gluconic acid, adipic acid, pimelic acid, maleic acid, phthalic acid, fumaric acid, malic acid, tartaric acid, and citric acid. Specific examples of sulfonic acid include methanesulfonic acid, ethanesulfonic acid, and isethionic acid.

As the complexing agent, a salt of these inorganic acids or organic acids may be used. In particular, in the case where a salt of a weak acid and a strong base, a salt of a strong acid and a weak base, or a salt of a weak acid and a weak base is used, buffering action of pH can be expected. Examples of the salt include potassium chloride, sodium sulfate, potassium nitrate, potassium carbonate, potassium tetrafluoroborate, potassium pyrophosphate, potassium oxalate, trisodium citrate, (+)-potassium tartrate, and potassium hexafluorophosphate.

Specific examples of nitrile compound include acetonitrile, aminoacetonitrile, propionitrile, butyronitrile, isobutyronitrile, benzonitrile, glutarodinitrile, and methoxyacetonitrile.

Specific examples of the amino acid include glycine, α-alanine, β-alanine, N-methylglycine, N,N-dimethylglycine, 2-aminobutyric acid, norvaline, valine, leucine, norleucine, isoleucine, phenylalanine, proline, sarcosine, ornithine, lysine, taurine, serine, threonine, homoserine, tyrosine, bicine, tricine, 3,5-diiodo-tyrosine, β-(3,4-dihydroxyphenyl)-alanine, thyroxine, 4-hydroxy-proline, cysteine, methionine, ethionine, lanthionine, cystathionine, cystine, cysteic acid, aspartic acid, glutamic acid, S-(carboxymethyl)-cysteine, 4-aminobutyric acid, asparagine, glutamine, azaserine, arginine, canavanine, citrulline, δ-hydroxy-lysine, creatine, histidine, 1-methyl-histidine, 3-methyl-histidine, and tryptophan.

Specific examples of the chelating agent include nitrilotriacetic acid, diethylenetriaminepenta-acetic acid, ethylenediaminetetraacetic acid, N,N,N-trimethylene phosphonic acid, ethylenediamine-N,N,N', N'-tetramethylene-sulfonic acid, trans-cyclohexanediaminetetraacetic acid, 1,2-diaminopropane tetraacetic acid, glycol ether diaminetetraacetic acid, ethylenediamine orthohydroxyphenylacetic acid, ethylenediamine disuccinic acid (SS form), N-(2-carboxylate ethyl)-L-aspartic acid, β-alanine diacetic acid, 2-phosphonobutane-1,2,4-tricarboxylic acid, 1-hydroxyethylidene-1,1-diphosphonic acid, N,N'-bis(2-hydroxybenzyl) ethylenediamine-N,N'-diacetic acid, and 1,2-dihydroxybenzene-4,6-disulfonic acid.

Of them, at least one type selected from the group consisting of an inorganic acid or a salt thereof, a carboxylic acid or a salt thereof, and a nitrile compound is preferable, and from the viewpoint of stability of the complex structure with a metal compound included in the polishing object, an inorganic acid or a salt thereof is more preferable. When one (e.g., various types of acids) having a pH adjusting function is used as the various types of complexing agents as stated above, such a complexing agent may be used as at least a part of the pH adjusting agent.

The lower limit of the content of the complexing agent in the polishing composition as a whole is not particularly limited because the complexing agent exerts its effect even in a small amount. Preferable content of the complexing agent in the polishing composition as a whole is 0.001 g/L or more, more preferably 0.01 g/L or more, and further preferably 1 g/L or more because the more complexing agent is included, the more improved polishing rate of a polishing object is achieved by such a polishing composition.

The less complexing agent is included in the polishing composition as a whole, the less polishing object is dissolved, and so a reduction property of a difference in level of the surface can be improved. Therefore the content of the complexing agent in the polishing composition as a whole is preferably 20 g/L or less, more preferably 15 g/L or less, and further preferably 10 g/L or less.

(Surfactant)

Surfactant may be added to the polishing composition. Since surfactant has an action to give hydrophilic property to the polished surface of the polishing object after the polishing, the polishing object after the polishing can have good washing efficiency, and adhesion of dirt, for example, to the surface can be suppressed. For the surfactant, any one of an anionic surfactant, a cationic surfactant, an amphoteric surfactant, and a nonionic surfactant can be used.

Specific examples of the anionic surfactant include polyoxyethylene alkyl ether acetic acid, polyoxyethylene alkyl sulfuric acid ester, alkyl sulfuric acid ester, polyoxyethylene alkyl ether sulfuric acid, alkyl ether sulfuric acid, alkylbenzene sulfonic acid, alkyl phosphoric acid ester, polyoxyethylene alkyl phosphoric acid ester, polyoxyethylene sulfosuccinic acid, alkylsulfosuccinic acid, alkylnaphthalenesulfonic acid, alkyl diphenyl ether disulfonic acid, and a salt thereof.

Specific examples of the cationic surfactant include an alkyltrimethylammonium salt, an alkyldimethylammonium salt, an alkylbenzyldimethylammonium salt, and an alkyl amine salt.

Specific examples of the amphoteric surfactant include alkylbetaine, and alkylamine oxide.

Specific examples of the nonionic surfactant include polyoxyethylene alkyl ether, polyoxyalkylene alkyl ether, sorbitan fatty acid ester, glycerin fatty acid ester, polyoxyethylene fatty acid ester, polyoxyethylene alkylamine, and alkyl alkanolamide.

These surfactants may be used singly or in combination of two or more types of them.

Since the more surfactant is included in the polishing composition as a whole, the more improved washing efficiency of the polishing object after the polishing is achieved, the content of the surfactant in the polishing composition as a whole is 0.0001 g/L or more preferably, and more preferably 0.001 g/L or more.

Since the less surfactant is included in the polishing composition as a whole, the less surfactant remains on the polished face of the polishing object after the polishing, i.e., the more improved washing efficiency is achieved, the content of the surfactant in the polishing composition as a whole is 10 g/L or less preferably, and more preferably 1 g/L or less.

(Water-Soluble Polymer)

Water-soluble polymer may be added to the polishing composition. Such water-soluble polymer added to the polishing composition can reduce the surface roughness of the polishing object after the polishing (can be smooth).

Specific examples of the water-soluble polymer include polystyrene sulfonate, polyisoprene sulfonate, polyacrylate, polymaleic acid, polyitaconic acid, polyvinyl acetate, polyvinyl alcohol, polyglycerol, polyvinylpyrrolidone, an isoprenesulfonic acid-acrylic acid copolymer, a polyvinyl pyrrolidone polyacrylic acid copolymer, a polyvinyl pyrrolidone vinyl acetate copolymer, a salt of naphthalenesulfonate formalin condensate, diallylamine hydrochloride sulfur dioxide copolymer, carboxymethylcellulose, a salt of carboxymethylcellulose, hydroxyethylcellulose, hydroxypropylcellulose, pullulan, chitosan, and chitosan salts. These water-soluble polymers may be used singly or in combination of two or more types of them.

Since the more water-soluble polymer is included in the polishing composition as a whole, the less surface roughness at the polished face of the polishing object is obtained, the content of the water-soluble polymer in the polishing composition as a whole is 0.0001 g/L or more preferably, and more preferably 0.001 g/L or more.

Since the less water-soluble polymer is included in the polishing composition as a whole, the less water-soluble polymer remains on the polished face of the polishing object, i.e., the more improved washing efficiency is achieved, the content of the water-soluble polymer in the polishing composition as a whole is 10 g/L or less preferably, and more preferably 1 g/L or less.

(Fungicide)

Examples of preservatives and fungicides that can be added to the polishing composition according to the present invention include isothiazoline preservatives, such as 2-methyl-4-isothiazoline-3-one and 5-chloro-2-methyl-4-isothiazoline-3-one, para-hydroxybenzonate esters, and phenoxyethanol. These preservatives and fungicides may be used singly or in combination of two or more types of them.

(Dispersion Medium or Solvent)

The polishing composition of the present invention typically includes a dispersion medium or a solvent to disperse or dissolve the components therein. Organic solvents and water can be used for the dispersion medium or the solvent. Of them, water is included preferably. From the viewpoint of prevention of inhibiting of the action of other components, water not containing impurities as much as possible is preferable. Specifically pure water or ultrapure water in which impurity ions are removed by an ion exchange resin and then foreign matters are removed through a filter, or distilled water is preferable.

4. Method for Manufacturing Polishing Composition

A method for manufacturing a polishing composition of the present invention is not limited especially, and the polishing composition can be obtained by stirring and mixing of other components as needed in water.

The temperature during mixing of the components is not particularly limited, and 10 to 40° C. is preferable. The temperature may be raised by heating to increase the rate of dissolution. The mixing duration also is not particularly limited.

5. Polishing Method (Polishing Device)

As a polishing device, a typical polishing device can be used, which includes a holder for holding a substrate having the polishing object and a motor having changeable rotation speed and the like, and includes a polishing surface plate to which a polishing pad (polishing cloth) is attachable.

(Polishing Pad)

As the polishing pad, typical nonwoven fabric, polyurethane, a porous fluorine resin can be used, for example, without any particular limitation. The polishing pad preferably has grooves so as to store a polishing liquid therein.

(Polishing Conditions)

Polishing conditions also are not particularly limited. For example, the rotating speed of the polishing surface plate is preferably 10 to 500 rpm, and the pressure applied to the substrate having a polishing object (polishing pressure) is preferably 0.1 to 10 psi. A method for supplying the polishing composition to the polishing pad also is not particularly limited. For example, a method for supplying the composition continuously with a pump and the like may be used. The supplying amount is not limited, and preferably the surface of the polishing pad is always covered with the polishing composition of the present invention.

After the completion of polishing, water droplets adhered to the substrate are shaken off with a spin dryer and the like for drying. Thereby, a substrate having a layer including elemental silicon can be obtained.

Examples

The invention will be described in more details with the following Examples and Comparative Examples.

As illustrated in Table 1, colloidal silica with sulfonic acid immobilized to the surface thereof, various types of organic acid, various types of conjugate base and water as fluid medium were mixed, and the polishing compositions of Examples 1, 2 and Comparative Examples 1 to 5 were manufactured. At this time, as illustrated in Table 1, Examples 1 and 2 included maleic acid and ammonium malate, and acetic acid and ammonium acetate, respectively, as their organic acid and conjugate base. Comparative Examples 1 to 3 and 5 included ammonium sulfate instead of the conjugate base of organic acid. Comparative Example 4 included maleic acid and ammonium citrate as the organic acid and the conjugate base of the organic acid.

In all of the polishing compositions of Examples 1 and 2 and Comparative Examples 1 to 5, colloidal silica with sulfonic acid immobilized to the surface thereof had the average primary particle diameter of 35 nm and the average secondary particle diameter of 70 nm. In all of the polishing compositions of Examples 1 and 2 and Comparative Examples 1 to 5, the content of colloidal silica with sulfonic acid immobilized to the surface thereof in the polishing composition as a whole was 3.8% by mass. For the values of pKa of the organic acids in the polishing compositions of Examples 1 and 2 and Comparative Examples 1 to 5, acetic acid had one value, maleic acid had two values, and citric acid had three values as in Table 1. The values of pH of all of these polishing compositions which were adjusted by a pH adjusting agent were within the range of 5.0 to 5.3 as in Table 1.

Using the polishing compositions in Examples 1, 2 and Comparative Examples 1 to 5, a polysilicon coat, a silicon dioxide coat and a silicon nitride coat formed on silicon wafers of 300 mm in diameter were polished under the following polishing conditions.

Polishing device: FREX 300E (produced by Ebara Corporation)
Polishing pressure: 2.0 psi
Rotating speed of polishing surface plate: 60 rpm
Rotating speed of carrier: 58 rpm
Supplying amount of polishing composition: 300 mL/min
Polishing duration: 60 seconds The polished silicon wafers were a silicon wafer with a silicon dioxide film (tetraethoxysilane film), a silicon wafer with a polysilicon film, and a silicon wafer with a silicon nitride film. In the following Table 1, "oxide" indicates the silicon wafer with a silicon dioxide film (tetraethoxysilane film), "poly-Si" indicates the silicon wafer with a polysilicon film, and "SiN" indicates the silicon wafer with a silicon nitride film.

For these silicon wafers, the thickness of each film before polishing and after polishing was measured using an optical interference type film-thickness measuring instrument. Then, the polishing rates of silicon dioxide, polysilicon and silicon nitride were calculated from their differences in thickness and polishing duration. Table 1 illustrates the result.

TABLE 1

| | Organic acid | Conjugate base | pKa of organic acid | pH | Electric conductivity | Polishing rate | | |
|---|---|---|---|---|---|---|---|---|
| | | | | | | SiN | Oxide | Poly-Si |
| Ex. 1 | Citric acid | Ammonium citrate | 3.09,4.75,6.41 | 5.16 | 8.06 | 54 | 185 | 97 |
| Ex. 2 | Acetic acid | Ammonium acetate | 4.76 | 5.26 | 8.16 | 211 | 206 | 98 |
| Comp. Ex. 1 | Maleic acid | Ammonium sulfate | 1.92,6.23 | 5.07 | 7.90 | 127 | 189 | 184 |
| Comp. Ex. 2 | Citric acid | Ammonium sulfate | 3.09,4.75,6.41 | 5.18 | 8.26 | 225 | 200 | 201 |
| Comp. Ex. 3 | Acetic acid | Ammonium sulfate | 4.76 | 5.19 | 8.53 | 114 | 184 | 203 |
| Comp. Ex. 4 | Maleic acid | Ammonium citrate | 1.92,6.23 | 5.02 | 8.17 | 171 | 190 | 225 |
| Comp. Ex. 5 | Maleic acid | Ammonium sulfate | 1.92,6.23 | 5.07 | 8.15 | 272 | 204 | 180 |

The result in Table 1 illustrates that polishing using the polishing compositions of Examples 1, 2 successfully limited the polishing rate of polysilicon and enabled polishing of silicon nitride and silicon dioxide at a higher polishing rate. On the contrary, it is illustrated that, although the polishing compositions of Comparative Examples 1 to 5 enabled polishing of silicon nitride and silicon dioxide at a higher polishing rate, their polishing rates of polysilicon were also high, meaning that they failed to limit the polishing rate of polysilicon while polishing it. Especially in Comparative Example 4, although an organic acid and a conjugate base of an organic acid were used, the conjugate base used was a conjugate base of an organic acid different from the organic acid used. As a result, the polishing rate of polysilicon was large, and the effect of limiting the polishing rate of polysilicon was not obtained.

The invention claimed is:

1. A polishing composition comprising: colloidal silica, an organic acid and a conjugate base of the same organic acid as the organic acid, wherein
    the conjugate base of the organic acid is at least one type selected from ammonium salt, sodium salt and potassium salt, and
    the organic acid is chemically bonded to a surface of the colloidal silica.

2. The polishing composition according to claim 1, wherein the organic acid has a value of pKa that is 0.3 or more and 6.0 or less, and the polishing composition has a value of pH that is equal to or higher than a value smaller than the value of pKa by 1.0 unit and that is equal to or lower than a value larger than the value of pKa by 1.5 units.

3. The polishing composition according to claim 1, wherein content of the colloidal silica with an organic acid immobilized to the surface thereof is 0.1% by mass or more and 20.0% by mass or less.

4. The polishing composition according to claim 1, wherein content of the conjugate base of the organic acid is 0.01% by mass or more and 10.0% by mass or less.

5. The polishing composition according to claim 1, wherein content of the organic acid is 0.01% by mass or more and 10.0% by mass or less.

6. The polishing composition according to claim 1, wherein the polishing composition is used for polishing a substrate including elemental silicon.

7. The polishing composition according to claim 6, wherein the elemental silicon is polysilicon.

8. A method for polishing, comprising polishing using the polishing composition according to claim 1.

9. The method for polishing according to claim 8, wherein a substrate including polysilicon is polished.

10. The polishing composition according to claim 2, wherein content of the colloidal silica with an organic acid immobilized to the surface thereof is 0.1% by mass or more and 20.0% by mass or less.

11. The polishing composition according to claim 4, wherein content of the colloidal silica with an organic acid immobilized to the surface thereof is 0.1% by mass or more and 20.0% by mass or less.

12. The method for polishing according to claim 8, wherein content of the colloidal silica with an organic acid immobilized to the surface thereof is 0.1% by mass or more and 20.0% by mass or less.

13. The polishing composition according to claim 2, wherein content of the conjugate base of the organic acid is 0.01% by mass or more and 10.0% by mass or less.

14. The method for polishing according to claim 8, wherein content of the conjugate base of the organic acid is 0.01% by mass or more and 10.0% by mass or less.

15. The method for polishing according to claim 9, wherein content of the conjugate base of the organic acid is 0.01% by mass or more and 10.0% by mass or less.

16. The polishing composition according to claim 3, wherein content of the conjugate base of the organic acid is 0.01% by mass or more and 10.0% by mass or less.

17. The polishing composition according to claim 1, wherein the polishing composition has pH of 5.3 or less.

* * * * *